(12) United States Patent
Reitz

(10) Patent No.: US 12,742,805 B2
(45) Date of Patent: Sep. 22, 2026

(54) METHOD FOR INSULATION MONITORING AND INSULATION MONITORING DEVICE WITH NETWORK BALANCING IN AN UNGROUNDED DIRECT VOLTAGE SYSTEM

(71) Applicant: Bender GmbH & Co. KG, Gruenberg (DE)

(72) Inventor: Julian Reitz, Gruenberg (DE)

(73) Assignee: Bender GmbH & Co. KG, Gruenberg (DE)

( * ) Notice: Subject to any disclaimer, the term of this patent is extended or adjusted under 35 U.S.C. 154(b) by 148 days.

(21) Appl. No.: 18/933,612

(22) Filed: Oct. 31, 2024

(65) Prior Publication Data

US 2025/0138068 A1 May 1, 2025

(30) Foreign Application Priority Data

Oct. 31, 2023 (DE) ........................ 10 2023 130 147

(51) Int. Cl.
*G01R 27/02* (2006.01)
*H02J 1/14* (2006.01)

(52) U.S. Cl.
CPC .............. *G01R 27/025* (2013.01); *H02J 1/14* (2013.01)

(58) Field of Classification Search
CPC ...... G01R 27/02; G01R 27/025; G01R 31/52; G01R 19/00; G01R 19/0084; G01R 27/18; G01R 31/12; G01R 31/1272; H02J 1/14; H01C 10/00; H01C 10/14; H01C 10/50
See application file for complete search history.

(56) References Cited

U.S. PATENT DOCUMENTS 12,374,883 B2 * 7/2025 Unru ........................ H02J 1/082
2023/0283072 A1 * 9/2023 Unru ........................ G05F 1/613 323/282

FOREIGN PATENT DOCUMENTS

CN 106483381 A * 3/2017 ........... G01R 27/025
DE 102018116055 B3 10/2019
DE 102018211625 A1 1/2020
DE 102020006919 A1 1/2022
DE 102022204417 B3 * 10/2023 ............ B60L 3/0069
WO 2020011458 A1 1/2020
WO 2023007253 A1 2/2023

* cited by examiner

*Primary Examiner* — Son T Le
(74) *Attorney, Agent, or Firm* — Dickinson Wright PLLC; Andrew D. Dorisio; Nicholas P. Coleman

(57) ABSTRACT

A method and an insulation monitoring device for insulation monitoring with network balancing in an ungrounded direct voltage system involves a measurement of conductor-to-ground voltages by means of voltage measuring devices; a computation of insulation resistances specifically for a conductor; and a compensation of an asymmetrical voltage between the conductor-to-ground voltages by means of a control circuit. A combination of an insulation monitoring function and network balancing based on a digital control circuit with the degree of asymmetry (asymmetrical factor) as control variable is provided. The asymmetrical voltage is compensated permanently via a suitable assessment of a (voltage) control error by means of a controller, and the resistance setting value required therefor is detected as a manipulated variable for one of the variable resistances.

14 Claims, 3 Drawing Sheets

METHOD FOR INSULATION MONITORING AND INSULATION MONITORING DEVICE WITH NETWORK BALANCING IN AN UNGROUNDED DIRECT VOLTAGE SYSTEM

This application claims priority to German Patent Application No. 10 2023 130 147.0 filed on Oct. 31, 2023.

TECHNICAL FIELD

The invention relates to a method for insulation monitoring with network balancing in an ungrounded direct voltage system having two active conductors, with a measurement of conductor-to-ground voltages between each one of the active conductors and ground by means of voltage measuring devices, a conductor-specific calculation of insulation resistances according to the specifications of the IEC 61557-8 standard and a balancing of an asymmetrical voltage between the conductor-to-ground voltages by means of a control circuit.

DESCRIPTION

The invention also relates to an insulation monitoring device with network balancing for operation in an ungrounded direct voltage system having two active conductors, having voltage measuring devices for measuring conductor-to-ground voltages between each one of the active conductors and ground and having an insulation monitoring function corresponding to standard IEC 61557-8 and having a conductor-specific computation of insulation resistances and having a control circuit for compensating an asymmetrical voltage between the conductor-to-ground voltages.

When higher requirements for the operational, fire and contact safety of electrical systems need to be fulfilled, the mains form of an ungrounded power supply system is used, which is also referred to as an isolated mains (isolé terre—IT) or IT (power supply) system. In this type of power supply system, the active parts are isolated from the ground potential, with respect to ground. The advantage of these systems is that in the event of an insulation fault, such as a ground fault or a body fault, the function of the connected electrical loads is not impaired, as a closed circuit cannot form between an active conductor of the network and ground due to the ideally infinitely large impedance value.

This inherent safety of the ungrounded power supply system thus means that a continuous power supply to the consumers fed by the ungrounded power supply system can be guaranteed even if an initial insulation fault occurs.

The resistance of the ungrounded power supply system to ground (insulation resistance, also insulation fault resistance or fault resistance in the event of a fault) is therefore constantly monitored, as a possible further fault on another active conductor would result in a fault loop and the fault current flowing in conjunction with an overcurrent protection device would result in the installation being switched off and operation coming to a standstill.

Insulation monitoring devices are used to ensure electrical safety with regard to monitoring the insulation resistance. State-of-the-art insulation monitoring devices according to product standard IEC 61557-8 determine the insulation resistance of the entire IT system to ground. An insulation monitoring device of this kind is connected between the active conductors and ground and superimposes a measurement voltage on the system (active measurement method). If an insulation fault occurs, the measuring circuit between the network and ground is closed via the insulation fault, meaning a measuring current proportional to the insulation fault arises. This measuring current causes a corresponding voltage drop at a measuring resistance in the insulation monitoring device, which is evaluated by the electronics and leads to an alarm message if a presettable limit value is exceeded.

Insulation monitoring devices which comply with standard IEC 61557-8 are therefore able to detect and report critical installation conditions, such as a too low insulation level, particularly in the presence of symmetrical insulation faults, or too high ground capacitance values and, if necessary, cause a faulty line branch to be disconnected.

Passive methods for measuring the insulation resistance which do not comply with standard IEC 61557-8, on the other hand, do not require active current or voltage sources and are based on detecting and evaluating the impedance of the conductor-to-ground paths by connecting and disconnecting or varying one or two artificially impressed conductor-to-ground impedances and their effect on the conductor-to-ground voltages. One example of this is the 3-voltmeter method, an insertion resistor being alternately connected between the positive active conductor and ground and the negative conductor and ground. The evaluation of the voltage measurements then leads to the required insulation resistance values.

The symmetry of the network voltage can also be used as a monitoring and signaling variable. The symmetry of the network voltage plays a crucial role in conjunction with natural and, above all, artificial ground leakage capacitances in ungrounded direct voltage systems.

According to the law $E=\frac{1}{2} C U^2$, the amount of energy which can be contained in a (ground leakage) capacitance C increases quadratically with the voltage. If there is a complete asymmetry of the active conductors coupled with a simultaneous doubling of the conductor-to-ground voltage, a significantly increased risk to people and property can exist when touching active conductors.

Solutions are now known from the state of the art to limit the energy stored in the power supply system and thus reduce the hazard potential.

In principle, it is possible to reduce the capacitances and/or to dimension them according to a worst-case scenario. The energy limitation of ground leakage capacitances in ungrounded power supply networks can be achieved through application-specific specifications for the size of the permissible capacitance value. However, this is not always possible depending on the size and extent of the ungrounded power supply system.

Alternatively and due to the quadratic influence of the voltage on the absorbed energy, passive or active balancing of the conductor-to-ground voltage is much more efficient.

A symmetrical voltage divider with a ground potential in the middle is a passive solution. As the used resistors, which remain permanently in the system, cannot be designed with sufficiently low impedance, this method is not a viable solution for asymmetrical reductions in the insulation resistance.

Active procedures, on the other hand, can evaluate the asymmetrical voltage and react accordingly.

Specification WO2023007253A1 discloses a network-balancing insulation monitoring device with active voltage asymmetry correction.

Analogously controllable voltage and current source circuits are used, which, however, lead to an extremely complex circuit architecture.

Another method is described in specification DE102020006919A1. Discrete resistance values are connected or disconnected between the active conductors and ground to compensate any voltage imbalances in a high-voltage system of a vehicle.

Specification DE102018116055B3 shows a method and insulation monitor for resistance-adaptive insulation monitoring. The method is essentially based on the 3-voltmeter method, two operating points being considered in which no discrete resistors are switched over, but a combination of semiconductor switch and resistor is modulated to a coupling resistance constant over a certain integration time. This also balances the direct voltage system, which reduces the energy content in the leakage capacitances in relation to a complete asymmetry. However, it is questionable whether complete symmetry can be achieved, as at least two operating points are required for the application of the 3-voltmeter method which has also been described. However, if the conductor-to-ground voltages are always symmetrical, there is no second operating point; an absolute determination of both, conductor-relevant, insulation resistances thus is not possible.

SUMMARY

The object of the present invention is therefore based on developing a method and an insulation monitoring device which implements the method, the method and the insulation monitoring device performing both robust network balancing and standard-compliant insulation resistance monitoring in an ungrounded direct voltage system in a component-efficient and thus cost-effective manner.

The object is attained in that the asymmetrical voltage is compensated by a digital control, a conductor-to-conductor voltage is multiplied by a specified asymmetrical factor to generate a weighted conductor-to-conductor voltage as a reference variable; subtracting one of the conductor-to-ground voltages from the weighted conductor-to-conductor voltage for registering a control error; computing a resistance setting value as a manipulated variable from the control error by means a discrete-time control algorithm implemented in a controller; setting one of the variable resistances each disposed between one of the active conductors and ground by means of the manipulated variable such that the voltage balancing of the conductor-to-ground voltages is continuously compensated; and computing the conductor-relevant insulation resistances from the variable resistances, which results as a function of the asymmetrical factor, at two different specified asymmetrical factors.

The present invention thus comprises a combination of insulation monitoring function and network balancing based on a digital control circuit with the degree of asymmetry (asymmetrical factor) as the controlled variable. The asymmetrical voltage is permanently compensated by suitable evaluation of a (voltage) control error by means of a controller and the resistance setting value required for this is determined as a manipulated variable for one of the variable resistances.

For this purpose, a specified asymmetrical factor is multiplied by the conductor-to-conductor voltage to generate a weighted conductor-to-conductor voltage as a reference variable. The difference between the weighted conductor-to-conductor voltage and one of the conductor-to-ground voltages yields the control error, which is fed to a digital controller which computes a resistance setting value as a manipulated variable for setting one of the variable resistances switched between one of the active conductors and ground. The conductor-relevant insulation resistances are then computed from the setting variable resistances at two operating points specified by two different asymmetrical factors. In contrast to the state of the art, a control variable is used to compute the insulation resistance for insulation monitoring.

With the method according to the invention, both network balancing and insulation monitoring in ungrounded direct voltage systems are realized and, contrary to known measurement technology, the degree of asymmetry of the conductor-to-ground voltages is given top priority due to the method.

The method is robust against changes in the operating voltage (nominal voltage), as the control is not based on the conductor-to-ground voltages as such, but on their ratio, i.e. the degree of asymmetry.

In a further embodiment, the controller executes a discrete-time PID control algorithm.

A PID control algorithm is preferably used in order to be able to influence not only the steady-state behavior (PI component) but also the dynamic behavior (PD component) of the control.

The method is therefore able to react particularly quickly to sudden, abrupt asymmetries, as the control errors amplified by the PID controller are quickly compensated.

Furthermore, a signal switch is used to control one of the variable resistances via the manipulated variable depending on the polarity of the control error.

To achieve the desired control effect, only one of the two variable resistances is controlled depending on the polarity. This is achieved using the polarity-dependent signal switch.

Preferably, the manipulated variable is limited by means of a saturation device, meaning the respective variable resistance can assume no more than a maximum resistance value.

Theoretically, the respective variable resistance could also assume the value infinity; however, from a control point of view, it makes sense to limit the oscillation of the manipulated variable to a maximum resistance value.

Furthermore, the variable resistance is set in such a manner that an electromechanical potentiometer having a drive, a switchable fixed resistance, a PWM-controlled semiconductor switch or an analogously controlled resistance replication having transistors is controlled as the variable resistance.

These embodiments of variable resistances allow the desired resistance values to be set precisely and without delay.

Preferably, the conductor-to-conductor voltage is computed by adding the conductor-to-ground voltages, or the conductor-to-conductor voltage is measured directly.

In addition to the possibility of computing the conductor-to-conductor voltage from the addition of the conductor-to-ground voltages obtained by individual measurements, the conductor-to-conductor voltage can also be determined directly by measurement. The measurement of one of the conductor-to-ground voltages would then not be necessary.

Furthermore, the two different specified asymmetrical factors (required for computing the conductor-relevant insulation resistances) are activated around the symmetry point in a symmetrical manner via cyclical switching, the switching times being controllable as a function of the control error.

In order to fulfill the function of insulation monitoring with computation of the conductor-specific insulation resistances, the network balancing control according to the invention is expanded by further elements. If network symmetry, i.e., the asymmetrical factor with the value 0.5 (symmetry point), were permanently compensated, the metrological task could not be solved. It would be possible to specify the ratio of the insulation resistances (positive/negative conductor to ground), but not their absolute values. Two operating points are therefore required to solve a linear system of equations. These are generated by allowing slight asymmetries, i.e., two asymmetrical factors which deviate from the symmetry point, and switching between them cyclically at intervals around the symmetry point.

The structural features of the insulation monitoring device with network balancing according to the invention described in claim 8 and in the claims referring to claim 8 carry out the corresponding method steps of the method according to the invention. Thus, the technical effects achieved using the method and the resulting advantages also apply equally to the insulation monitoring device with network balancing according to the invention.

In particular, it has proven to be advantageous for the insulation monitoring device with network balancing according to the invention requires very few external components, i.e., two voltage measuring devices and two variable resistances.

BRIEF DESCRIPTION OF THE DRAWINGS

Further advantageous embodiment features are shown in the following description and the drawings, which illustrate a preferred embodiment of the invention by means of examples.

DETAILED DESCRIPTION

Figure 1:
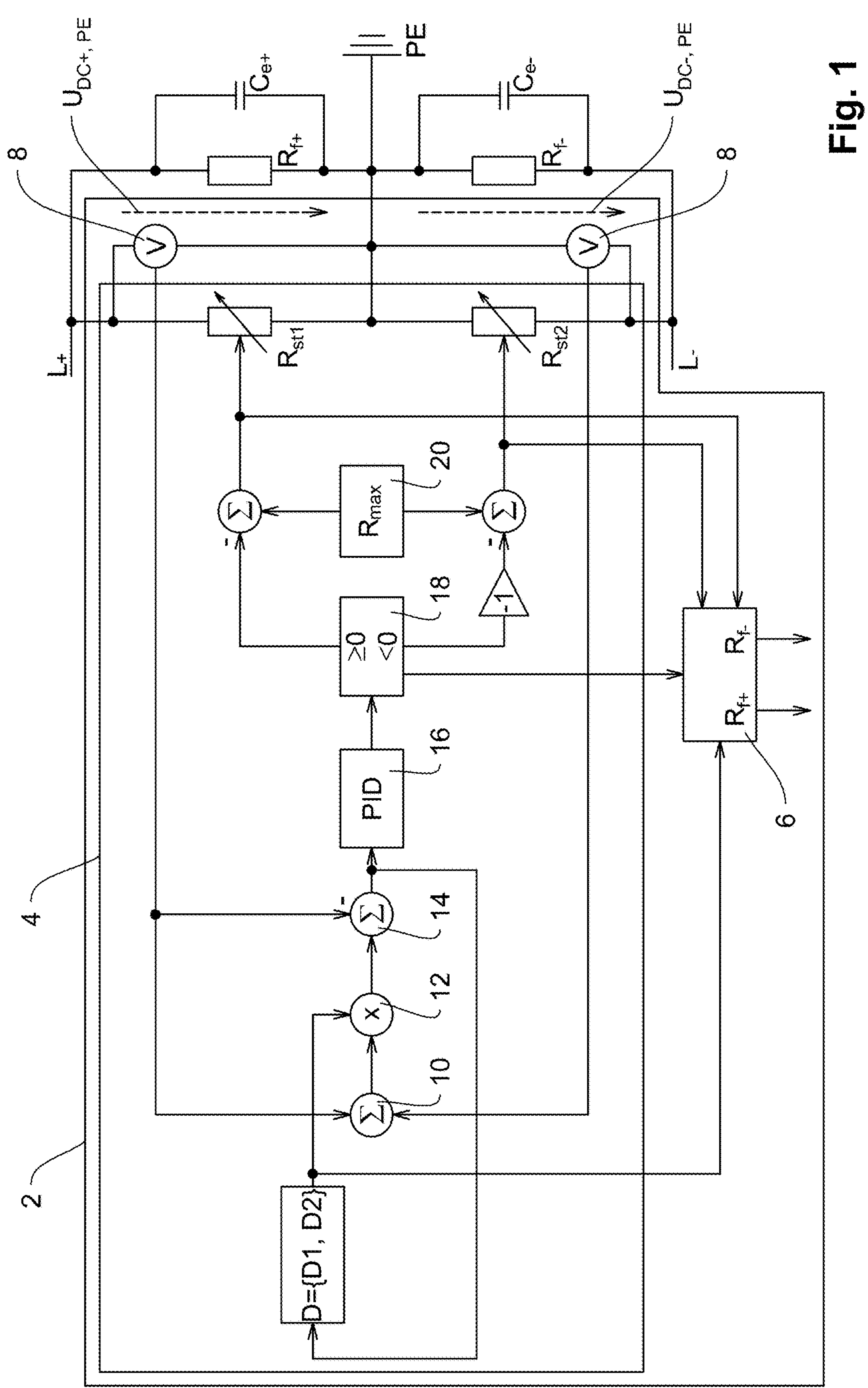
FIG. 1 shows a functional block diagram of the insulation monitoring device with network balancing according to the invention.

FIG. 1 shows a functional block diagram of the method according to the invention via an insulation monitoring device 2 according to the invention and implementing this method. The insulation monitoring device 2 is installed in an ungrounded direct voltage system having two active conductors $L_+$, $L_-$. The insulation resistances $R_{f+}$, $R_{f-}$ to be monitored and the unavoidable leakage capacitances $C_{e+}$, $C_{e-}$ of the ungrounded direct voltage system are shown between each of the active conductors $L_+$, $L_-$ and ground PE.

The core elements of the insulation monitoring device 2 are a control circuit 4 implemented as a digital control and serving to establish symmetry between the conductor-to-ground voltages $U_{DC+, PE}$, $U_{DC-, PE}$ and an insulation monitoring function 6 for conductor-specific computation of the insulation resistances $R_{f+}$, $R_{f-}$.

For this purpose, both conductor-to-ground voltages $U_{DC+, PE}$, $U_{DC-, PE}$ are measured by means of voltage measuring devices 8 and fed to an adder 10, which determines the conductor-to-conductor voltage $U_{DC+, DC-}$. An analog-to-digital conversion of the measured variables is implicitly assumed and is not shown.

The conductor-to-conductor voltage $U_{DC+, DC-}$ is then multiplied by a specified asymmetrical factor D, resulting in a weighted conductor-to-conductor voltage at the output of a multiplier 12 as the actual reference variable w(t) of the control.

Subsequently, a control error e(t) is determined by a subtractor 14 from the conductor-to-conductor voltage $U_{DC+, DC-}$ weighted with the asymmetrical factor D and one of the conductor-to-ground voltages, here $U_{DC+, PE}$, and fed to a controller 16.

The controller 16 computes a resistance setting value from the control error e(t) using a discrete-time PID control algorithm as a manipulated variable u(t) for setting one of the variable resistances $R_{st1}$, $R_{st2}$ disposed between one of the active conductors $L_+$, $L_-$ and ground PE.

A polarity-dependent signal switch 18 decides, depending on the polarity of the control error e(t), which of the variable resistances $R_{st1}$, $R_{st2}$ is controlled by the manipulated variable u(t).

The control circuit 4 also has a saturation device 20, meaning the respective variable resistance $R_{st1}$, $R_{st2}$ can assume no more than a maximum resistance value $R_{max}$.

Figure 2:
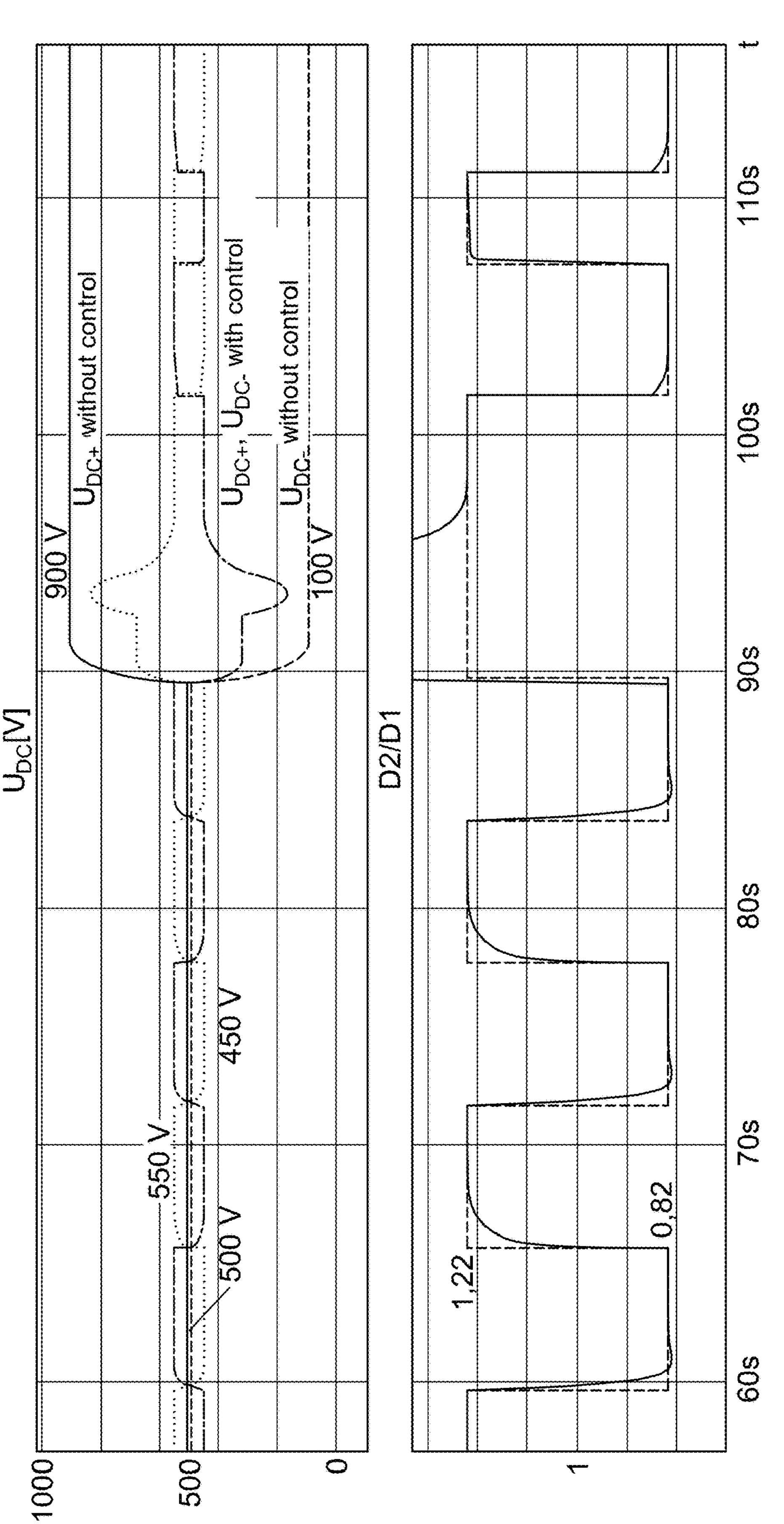
FIG. 2 shows a simulated curve of the conductor-to-ground voltages and a curve of the ratio of the asymmetrical factors in the event of a jump in the insulation resistance $R_{f-}$.

FIG. 2 shows the simulation result as a curve of the conductor-to-ground voltages $U_{DC+, PE}$, $U_{DC-, PE}$ and as a curve of the ratio of the asymmetrical factors $D_1$, $D_2$ when the insulation resistance $R_{f-}$ jumps from 200 kΩ to 20 kΩ.

Without controlling the network symmetry, the conductor-to-ground voltages $U_{DC+, PE}$, $U_{DC-, PE}$ initially correspond to the nominal voltage of 500 V, as the direct voltage system is in a symmetrical state with $R_{f+}=R_{f-}=200$ kΩ. After a jump in the insulation resistance $R_{f-}$ from 200 kΩ to 20 kΩ, which causes the unbalance, the conductor-to-ground voltages change to $U_{DC+, PE}=900$ V or $U_{DC-, PE}=100$ V.

With the control according to the invention, the asymmetrical factor $D=\{D_1, D_2\}$ is switched cyclically between the two values $D_1=0.45$ and $D_2=0.55$ in order to generate the two required operating points for computing the insulation resistances with this deliberately permitted slight asymmetry. The direct voltage system is initially in a symmetrical state with $R_{f+}=R_{f-}=200$ kΩ and the conductor-to-ground voltages $U_{DC+, PE}$, $U_{DC-, PE}$ run symmetrically and alternately around the nominal voltage of 500 V with values of 550 V and 450 V, due to the slight "symmetrical" asymmetry. After the jump in the insulation resistance $R_{f-}$ from 200 kΩ to 20 kΩ—the insulation resistance $R_{f+}=200$ kΩ remains unchanged—, the asymmetry caused by the jump is compensated after a short transition phase and the output values of the conductor-to-ground voltages $U_{DC+, PE}$, $U_{DC-, PE}$ of 450 V and 550 V are restored.

The diagram below shows the corresponding curve of the ratio of the asymmetrical factors $D_2/D_1$. With the deliberately set slight asymmetry, this alternates between 0.55/0.45=1.22 and 0.45/0.55=0.82 and is also compensated to these values again after the asymmetry caused by the jump in the insulation resistance $R_{f-}$ from 200 kΩ to 20 kΩ.

Figure 3:
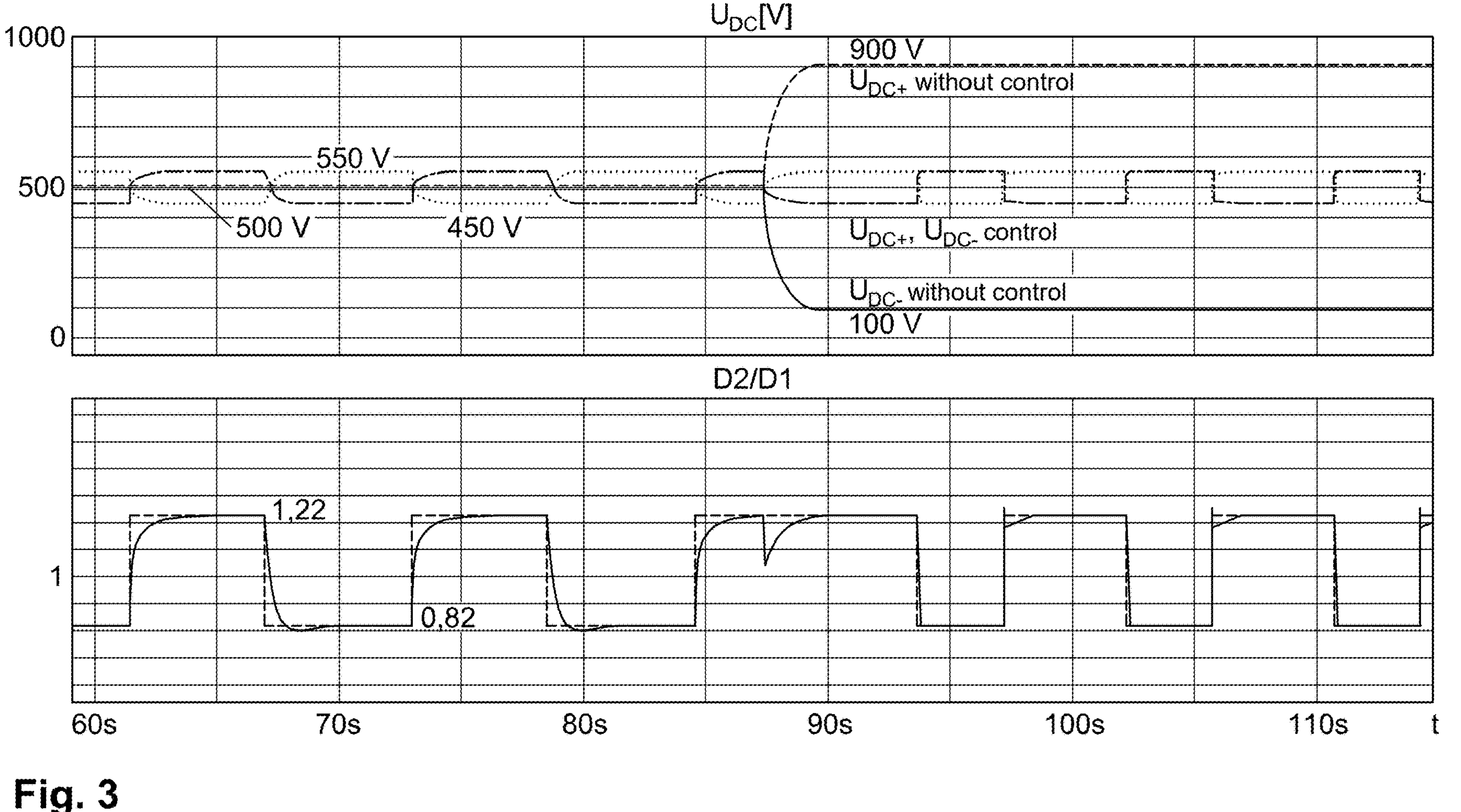
FIG. 3 shows a simulated curve of the conductor-to-ground voltages and a curve of the ratio of the asymmetrical factors in the event of a jump in the insulation resistance $R_{f+}$.

FIG. 3 shows the simulation results analogous to FIG. 2 for a jump in the insulation resistance $R_{f+}$ from 200 kΩ to 20 kΩ—the insulation resistance $R_{f-}=200$ kΩ remains unchanged. This figure also shows that the conductor-to-ground voltages $U_{DC+, PE}$, $U_{DC-, PE}$ (upper diagram) as well as the ratio of the asymmetrical factors $D_2/D_1$ (lower diagram) are compensated to their initial values.

In the simulation results shown, cyclical switching takes place at a fixed period. In practice, however, the switching does not follow a fixed time sequence, but is based on the evaluation of the control error e(t). After switching the asymmetrical factor $D=\{D_1, D_2\}$, a fixed time interval, e.g., T=1 s, is first waited for. During this wait, no action takes place until the control error e(t) is almost zero. Once this state is reached, the variable resistances $R_{st1}(D)$, $R_{st2}(D)$ are added to the computation of the conductor-relevant insulation resistances $R_{f+}$, $R_{f-}$ and the asymmetrical factor is subsequently changed.

The conductor-relevant insulation resistances $R_{f+}$, $R_{f-}$ is computed based on the variable resistances $R_{st1}(D)$, $R_{st2}(D)$, which are set as a function of the current and cyclically changing asymmetrical factor $D=\{D_1, D_2\}$.

The information from the signal switch 18 is also included in the computation, i.e., which of the two variable resistances $R_{st1}$, $R_{st2}$ is used/active. This is necessary, as there are optimized equations for both cases, which should then be used accordingly.

The following applies to $R_{st1}$ active:

$$R_{f-} = \frac{D_2 - D_1}{-\frac{D_2}{R_{st2}(D_1)} + \frac{D_1 D_2}{R_{st1}(D_1)} + \frac{D_1}{R_{st2}(D_2)} + \frac{D_1 D_2}{R_{st1}(D_2)}}$$

$$R_{f+} = \frac{1}{\frac{\frac{1}{R_{f-}} + \frac{1}{R_{st2}(D_1)}}{D_1} - \frac{1}{R_{st1}(D_1)}}$$

The following applies to $R_{st2}$ active:

$$R_{f+} = \frac{D_2 - D_1}{\frac{D_1 - D_2}{R_{st1}(D_1)} - \frac{1}{R_{st2}(D_1)} + \frac{1}{R_{st2}(D_2)}}$$

$$R_{f-} = \frac{1}{D_2\left(\frac{1}{R_{f+}} + \frac{1}{R_{st1}(D_2)}\right) - \frac{1}{R_{st2}(D_2)}}$$

In an advantageous manner, the degree of asymmetry to be permitted in order to fulfill the insulation monitoring function can be determined on an application-specific basis. It would also be possible to compute the insulation resistance only at certain times and to apply a complete network symmetry in the remaining time—completely without the slight asymmetry required to compute the insulation resistances. It is also possible to switch off the insulation-resistance measurement function permanently.

The invention claimed is:

1. A method for insulation monitoring with network balancing in an ungrounded direct voltage system having two active conductors ($L_+$, $L_-$), the method comprising the following steps:

measuring conductor-to-ground voltages ($U_{DC+,\ PE}$, $U_{DC-,\ PE}$) between each one of the active conductors ($L_+$, $L_-$) and ground (PE) by means of voltage measuring devices, computing conductor-specific insulation resistances ($R_{f+}$, $R_{f-}$) according to the specifications of standard IEC 61557-8, compensating an asymmetrical voltage between the conductor-to-ground voltages ($U_{DC+,\ PE}$, $U_{DC-,\ PE}$) by means of a control circuit (4), wherein the asymmetrical voltage is compensated via a digital control (4), wherein a conductor-to-conductor voltage ($U_{DC+,\ DC-}$) is multiplied by a specified asymmetrical factor (D) to generate a weighted conductor-to-conductor voltage as a reference variable (w(t));

subtracting (14) one of the conductor-to-ground voltages ($U_{DC+,\ PE}$, $U_{DC-,\ PE}$) from the weighted conductor-to-conductor voltage (w(t)) for registering a control error (e(t));

computing a resistance setting value as a manipulated variable (u(t)) from the control error (e(t)) by means a discrete-time control algorithm implemented in a controller (16), setting one of the variable resistances ($R_{st1}$, $R_{st2}$) each disposed between one of the active conductors ($L_+$, $L_-$) and ground (PE) by means of the manipulated variable (u(t)) such that the voltage balancing of the conductor-to-ground voltages ($U_{DC+,\ PE}$, $U_{DC-,\ PE}$) is continuously compensated, and computing the conductor-relevant insulation resistances ($R_{f+}$, $R_{f-}$) from the variable resistances ($R_{st1}$, $R_{st2}$), which result as a function of the asymmetrical factor (D), at two different specified asymmetrical factors ($D_1$, $D_2$).

2. The method according to claim 1, wherein the controller (16) executes a discrete-time PID control algorithm.

3. The method according to claim 1, wherein one of the variable resistances ($R_{st1}$, $R_{st2}$) is controlled by the manipulated variable (u(t)) by means of a signal switch (18) depending on the polarity of the control error (e(t)).

4. The method according to claim 1, wherein the manipulated variable (u(t)) is limited by means of a saturation device (20) so the respective variable resistance (Rst1, Rst2) remains no greater than a maximum resistance value (Rmax).

5. The method according to claim 1, wherein the variable resistance ($R_{st1}$, $R_{st2}$) is set in such a manner that an electromechanical potentiometer having a drive, a switchable fixed resistor, a PWM-controlled semiconductor switch or an analogously controlled resistor replication having transistors is controlled as a variable resistance.

6. The method according to claim 1, wherein the conductor-to-conductor voltage ($U_{DC+,\ DC-}$) is computed by adding (10) the conductor-to-ground voltages ($U_{DC+,\ PE}$, $U_{DC-,\ PE}$), or the conductor-to-conductor voltage ($U_{DC+,\ DC-}$) is directly measured.

7. The method according to claim 1, wherein the two different specified asymmetrical factors ($D_1$, $D_2$) are activated about the symmetry point in a balanced manner via cyclical switching, the switching times being controllable as a function of the control error (e(t)).

8. An insulation monitoring device having network balancing for operation in an ungrounded direct voltage system having two active conductors ($L_+$, $L_-$), the insulation monitoring device comprising voltage-measuring devices for measuring conductor-to-ground voltages ($U_{DC+,\ PE}$, $U_{DC-,\ PE}$) between each of the active conductors ($L_+$, $L_-$) and ground (PE), an insulation monitoring function according to standard IEC 61557-8 and using conductor-specific computation of insulation resistances ($R_{f+}$, $R_{f-}$) and having a control circuit (4) for compensating an asymmetrical voltage between the conductor-to-ground voltages ($U_{DC+,\ PE}$, $U_{DC-,\ PE}$), wherein the control circuit is implemented as a digital control (4) comprising the following functional blocks:

a multiplier (12) for multiplying a specified asymmetrical factor (D) by a conductor-to-conductor voltage ($U_{DC+}$, $U_{DC-}$) to generate a weighted conductor-to-conductor voltage ($U_{DC+}$, $U_{DC-}$) as a reference variable (w(t));

a subtractor (14) which determines a control error by subtracting one of the conductor-to-ground voltages ($U_{DC+,\ PE}$, $U_{DC-,\ PE}$) from the weighted conductor-to-conductor voltage (w(t));

a controller (16) which computes a resistance setting value as a manipulated variable (u(t)) by means of a discrete-time control algorithm;

a variable resistance ($R_{st1}$, $R_{st2}$) which is disposed between each of the active conductors ($L_+$, $L_-$) and ground (PE) and is selectively set in such a manner via the manipulated variable (u(t)) that the voltage balancing of the conductor-to-ground voltages ($U_{DC+,\ PE}$, $U_{DC-,\ PE}$) is continuously compensated;

an insulation-resistance computation for determining the conductor-relevant insulation resistances ($R_{f+}$, $R_{f-}$) from the variable resistances ($R_{st1}$, $R_{st2}$) resulting as a function of the asymmetrical factor (D) at two different specified asymmetrical factors ($D_1$, $D_2$).

9. The insulation monitoring device with network balancing according to claim 8, wherein a discrete-time PID control algorithm is implemented in the controller (16).

10. The insulation monitoring device with network balancing according to claim 8, wherein a signal switch (18) which controls one of the variable resistances ($R_{st1}$, $R_{st2}$) via the manipulated variable (u(t)) depending on the polarity of the control error (e(t)).

11. The insulation monitoring device with network balancing according claim 8, further including a saturation device (20) which limits the manipulated variable (u(t)) so the respective variable resistance (Rst1, Rst2) is limited to a value no greater no more than a maximum resistance value (Rmax).

12. The insulation monitoring device with network balancing according to claim 8, wherein the variable resistances ($R_{st1}$, $R_{st2}$) are each implemented as an electromechanical potentiometer having a drive, a switchable fixed resistor, a PWM-controlled semiconductor switch or an analogously controlled resistor replication having transistors.

13. The insulation monitoring device with network balancing according to claim 8, further including a summer (10) for adding the conductor-to-ground voltages ($U_{DC+,\ PE}$, $U_{DC-,\ PE}$) to generate the conductor-to-conductor voltage ($U_{DC+}$, $U_{DC-}$), or a voltage-measuring device for directly measuring the conductor-to-conductor voltage ($U_{DC+}$, $U_{DC-}$).

14. The insulation monitoring device with network balance according to claim 8, further including a configuration for activating the two different specified asymmetrical factors ($D_1$, $D_2$) about the symmetrical point in a symmetrical manner via a cyclical switching, the switching times being controllable as a function of the control error (e(t)).

* * * * *